United States Patent [19]

Hall

[11] Patent Number: 5,638,003
[45] Date of Patent: Jun. 10, 1997

[54] METHOD AND APPARATUS FOR TESTING SURFACE BREAKDOWN OF DIELECTRIC MATERIALS CAUSED BY ELECTRICAL TRACKING

[75] Inventor: Jeffrey B. Hall, Clayton, N.C.

[73] Assignee: Underwriters Laboratories, Inc., Northbrook, Ill.

[21] Appl. No.: 447,644

[22] Filed: May 23, 1995

[51] Int. Cl.⁶ ................................................. G01R 31/18
[52] U.S. Cl. ......................... 324/514; 324/760; 324/554; 438/17
[58] Field of Search .................................. 324/514, 558, 324/760, 554; 417/8

[56]  References Cited

U.S. PATENT DOCUMENTS

| | | | |
|---|---|---|---|
| 4,339,708 | 7/1982 | Saito et al. | |
| 4,473,795 | 9/1984 | Wood | 324/514 |
| 4,757,255 | 7/1988 | Margozzi | 324/760 |
| 5,198,752 | 3/1993 | Miyata | 324/760 |
| 5,457,389 | 10/1995 | Shibata | 324/514 |

FOREIGN PATENT DOCUMENTS 752514  5/1980  U.S.S.R. .

*Primary Examiner*—Kenneth A. Wieder
*Assistant Examiner*—Jose M. Solis
*Attorney, Agent, or Firm*—Welsh & Katz, Ltd.

[57]  ABSTRACT

An apparatus for testing a dielectric sample for susceptibility to surface electrical failure due to tracking. The apparatus includes an enclosure continuously purged of air-borne contaminants, which eliminates external drafts, and a base disposed within the enclosure for supporting the dielectric sample. A pair of electrodes are operably interconnected with a variable voltage power supply and adapted to engage the dielectric sample on a first side with a mutual separation. A source of water and water borne contaminants intermittently discharges the water and water-borne contaminants in droplet form onto the dielectric test sample between the electrodes.

26 Claims, 6 Drawing Sheets

METHOD AND APPARATUS FOR TESTING SURFACE BREAKDOWN OF DIELECTRIC MATERIALS CAUSED BY ELECTRICAL TRACKING

FIELD OF THE INVENTION

The present invention relates generally to the testing of dielectric materials, and more particularly to a novel method and apparatus for surface testing dielectric materials for surface breakdown caused by electrical tracking in the presence of contaminants.

BACKGROUND

Surface failure of dielectric materials (i.e., electrical insulators) in the presence of contaminants is a phenomenon well known in the art. While electrical insulators may be fabricated having a very high resistance to electrical breakdown through a body of the dielectric material, a more likely mode of failure of such insulators is often over an outside surface of the insulator especially where the surface of the dielectric material of the insulator is exposed to environmental factors (e.g., rain mixed with air pollution). Where an insulator is exposed to such conditions, an electrical short circuit may occur across the surface of the insulator. Apart from the damage a short circuit may cause to the electrical system itself, the arc may also damage the insulator.

The conditions which may lead to arcing of an insulator in the presence of contaminants is often controlled by a number of factors. Chief among the factors is the voltage applied across the insulator and the electrical rating of the insulator itself. Rain striking the insulator forms a thin conductive film across the surface of the insulator. Where the surface of the insulator is impervious to the penetration of water (e.g., fired ceramic) the film may remain thin and the potential for arcing small. Where the insulator is porous (e.g., unfired ceramic) the film of water and contaminants effectively becomes thicker due to penetration of the water and contaminants into the insulator.

When an arc occurs across a ceramic, the heat of the arc may drive away the water leaving only the undissolved contaminants of the air pollution deposited on the insulator as a solid coating material. Subsequent raindrops striking a fired ceramic insulator may dilute and wash away the deposited air pollution. On the other hand, where the insulator is fabricated of a porous ceramic, the contaminants are often deposited within the porous matrix of the ceramic and cannot be washed away. Subsequent deposits and arcing causes an accumulation of contaminants within and near the surface of the insulator and progressively more severe arcing. Where the contaminant is an organic material the heat of the arc will often result in the contaminant being reduced to a conductive carbonaceous material.

In either case, the localized presence of carbon on or near the surface of the insulator will often be the source of subsequent arcs and eventually a path of carbon will develop providing a track for subsequent arcing. The accumulation of the carbon into a continuous path is commonly referred to as tracking.

Where the insulator is also fabricated of an organic material (e.g., plastic), tracking can occur at a much faster rate due to thermal breakdown of the organic material. When a first arc occurs, the contaminants and also the plastic along the path of the arc may be converted into carbon by the heat of the arc. Since porosity of the insulator is an important factor in tracking, even non-electrolytes (e.g., solvents or airborne dust) may exacerbate tracking by accumulating and penetrating the insulator to provide a source of an initial and subsequent arcs.

In an effort to provide a measure of susceptibility of insulators to tracking, the International Electrotechnical Commission (IEC), ASTM D3638, DIN 53480, BSI 5901, VDE 0303-TEiL1, AFNORC 26220 have developed a standardized test described as a comparative tracking index test (hereinafter referred to as the "CTI test"). Under the CTI test, a pair of standardized electrodes are disposed on a surface of a test sample of the dielectric material of an insulator and an electrolyte is deposited on the dielectric between the electrodes by a slow dripping process.

Failure of a dielectric specimen under the CTI test is defined by a current of at least 0.5 ampere for two seconds before at least 50 droplets have fallen onto the sample. The comparative measurement of failure is referred to as the "comparative tracking index number", or simply "CTI", and is the magnitude of the highest voltage reached before failure.

To improve accuracy of the CTI test, IEC, ASTM, BSI, etc. test Publications specify a number of test parameters. First, the electrodes are to be mutually separated by a distance of 4.0 (+0.1, −0.1) mm during testing. The droplets striking the test sample are to be of a diameter of 20 (+3, −0) $mm^3$ and are to be released from a specified height above the test sample. The test procedures recommend cleaning the electrodes before each use. Further, the electrodes must have a specified weight such that the electrodes exert a constant force against the surface of the specimen.

While the CTI tests have been of significant value in providing comparative data on dielectric materials, the results of the tests often vary significantly for identical specimens. Such variance creates uncertainty in the validity of any particular test result and offers the opportunity for abuse of the testing procedure.

One invention intended to reduce the variability of the IEC test was provided by Saito et al. in U.S. Pat. No. 4,339,708 (Saito). Saito recognized that some of the variables associated with testing may result from contamination of the droplet nozzle, and went on to introduce other variables by allowing movement of the droplet nozzle before and during release of the droplets. Such movement, while intending to reduce variability of the IEC test, may actually have increased variability.

The CTI test is of considerable importance not only to power companies but also to manufacturers of any power consuming device subject to environmental factors. Because of the importance of CTI testing a more reproducible method is needed for implementing the test of IEC Publication 112.

SUMMARY OF THE INVENTION

One of the primary objects of the present invention is to improve the reliability of dielectric surface testing by surrounding a testing fixture with an air-tight enclosure and purging the enclosure of smoke or other air-borne contaminants at a predetermined rate during testing.

A further objective of the present invention is to improve the reliability of dielectric surface testing by providing a set of vertically floating test electrodes which provide a constant-force contact with the dielectric surface during testing.

It is a further objective of the invention to improve the reliability of dielectric surface testing by providing a means of detecting burn-through of the dielectric test sample by a set of test electrodes.

It is a further objective of the invention to improve the reliability of dielectric surface testing by using optical detectors for control of contaminant deposition during testing.

These and other objectives are provided by a method and apparatus for testing a dielectric sample for susceptibility to surface electrical failure due to tracking. The apparatus includes an enclosure continuously purged of air-borne contaminants and a base disposed within the enclosure for supporting the dielectric sample. A pair of electrodes are operably interconnected with a variable voltage power supply and engage the dielectric test sample on a first side with a mutual separation. A source of water and water borne contaminants intermittently discharges the water and waterborne contaminants in droplet form onto the dielectric test sample between the electrodes.

The solution to the problem of producing consistent test results under CTI tests lies, conceptually, in controlling the entire testing environment instead of compensating for the effects of local contamination as taught by Saito and others. While Saito taught that contamination of the droplet nozzle could be avoided by a higher flow rate of droplets and by moving the nozzle away from the dielectric specimen during release of a droplet, the present invention operates on the theory that contamination of the droplet nozzle may be more effectively avoided by enclosing the testing specimen, electrodes, and nozzle in an air-tight chamber and flushing the chamber with a controlled quantity of air or other appropriate gas.

It has also been determined that burn-through may effect the validity of CTI testing results, where the testing electrodes burn through a test specimen of dielectric material preventing surface tracking at the 4 mm distance between the electrode tips. In accordance with the present invention, a pair of sensors are located under the test sample and trigger an alarm upon burn-through thereby eliminating the uncertainties associated with such a condition.

In additions to the problems caused by electrode burn-through, it has also been determined that conventional methods of electrode support do not maintain precise horizontal position of the electrodes at the required 4 mm separation, for instance when burning occurs beneath the electrodes and the electrodes begin to penetrate the sample. In accordance with the invention, the electrodes movements are restricted to traveling in a vertical plane on a linear bearing for purposes of maintaining a precise horizontal distance.

It has also been determined that flooding is a significant factor in testing variability where an envelope voltage is set too low to evaporate accumulated droplets. The accumulation of droplets results in overflow of the test area and shorting of the electrodes, preventing establishment of a valid CTI value. The present invention detects such condition by locating sensors around the periphery of the support base under the test sample, terminating the test and sounding an alarm upon detection of such a condition.

Further objects, features and advantages of the present invention will become apparent from the following detailed description of the invention taken in conjunction with the accompanying drawings wherein like reference numerals designate like elements throughout the several views.

DESCRIPTION OF A PREFERRED EMBODIMENT

Figure 1:
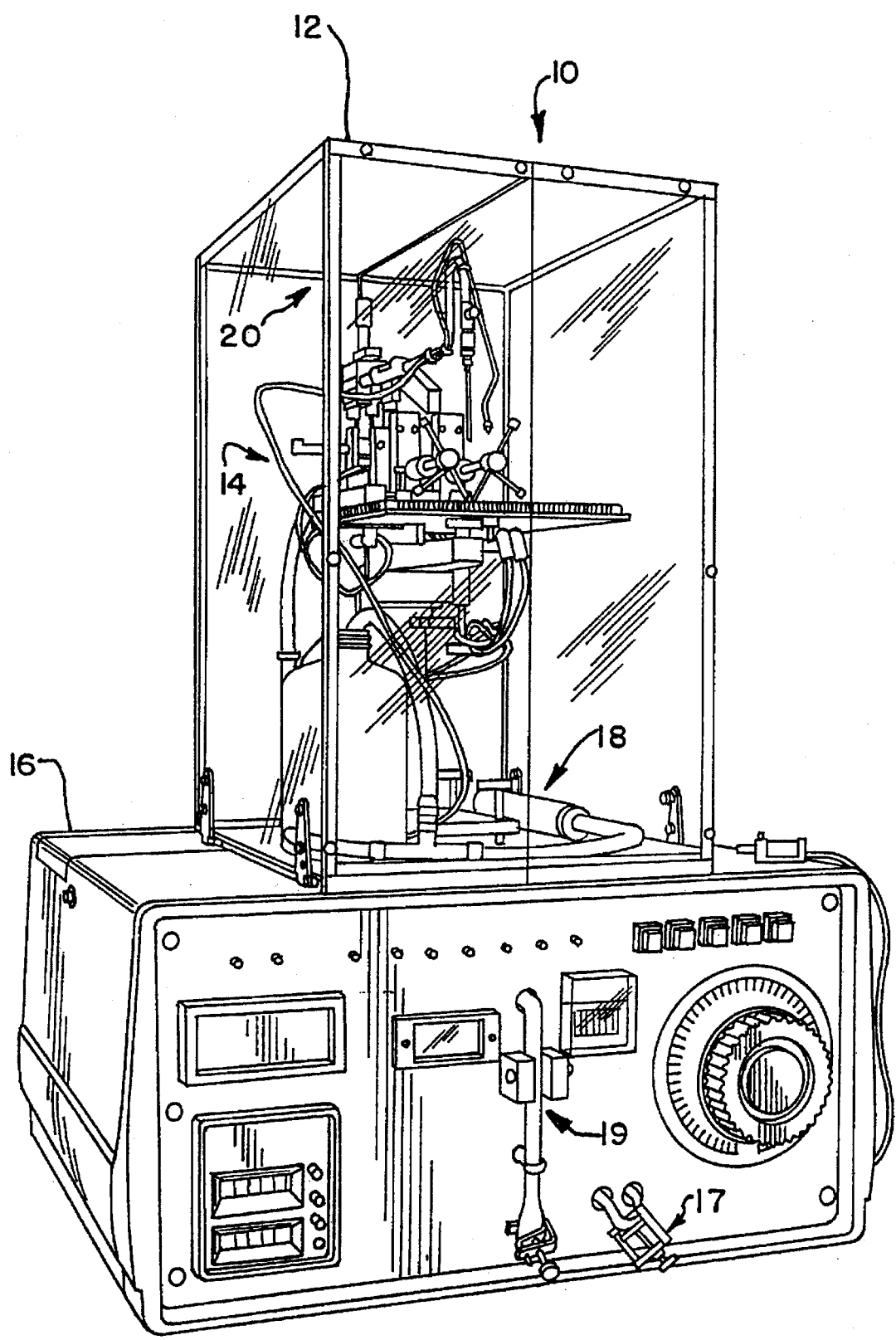
FIG. 1 is a perspective view of a test system in accordance with a preferred embodiment of the present invention.
Figure 6:
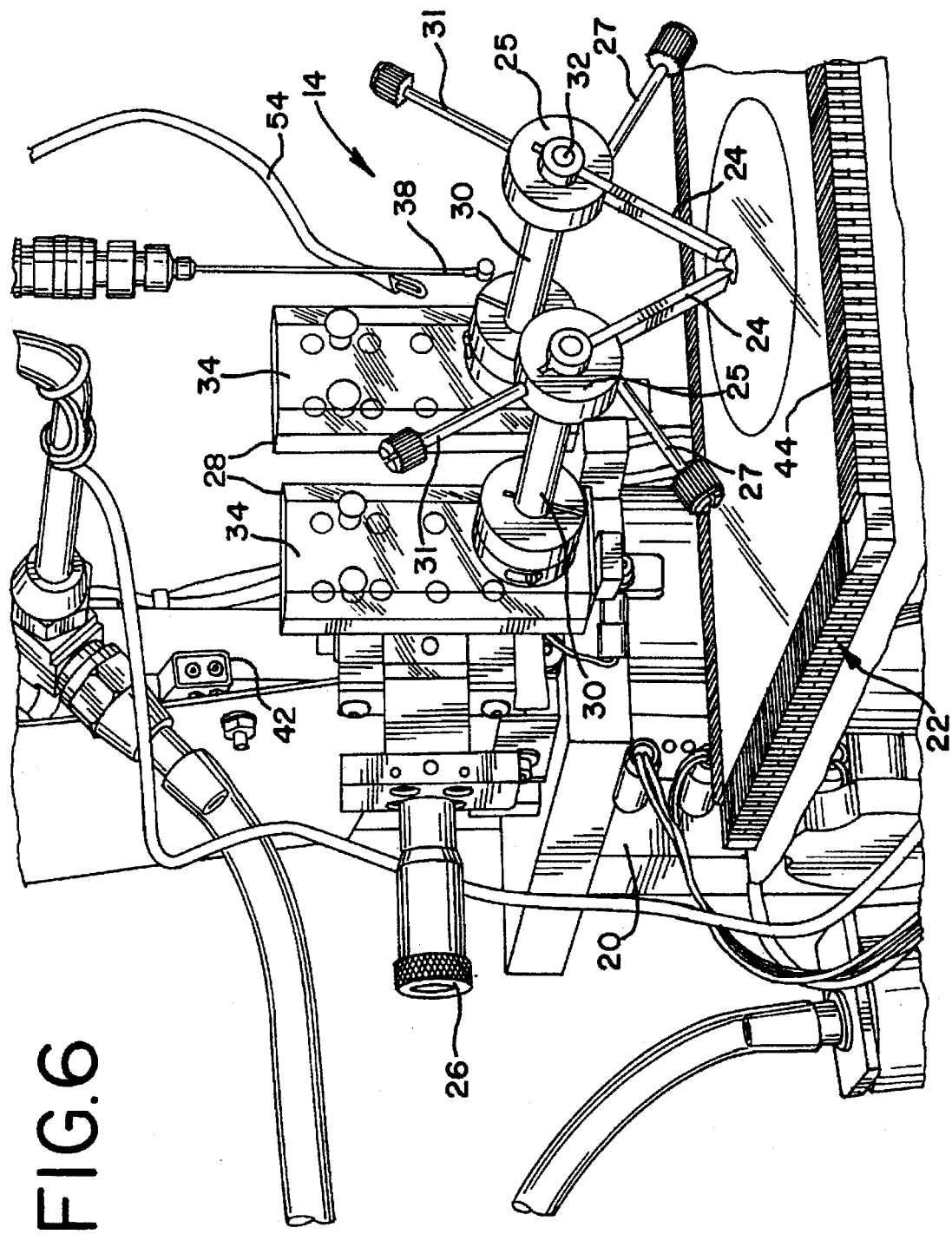
FIG. 6 is a perspective view of the base of the system of FIG. 1 with the cover removed.

Referring now to the drawings, FIG. 1 is a perspective view of a test apparatus in accordance with the present invention, indicated generally at 10, for carrying out testing under IEC Publication 112, ASTM D3638, DIN 53480, BSI 5901, VDE 0303 TEiL, AFNORC 26220. The test apparatus 10, which may alternatively be referred to as a test system, includes a rectangular enclosure 12 which surrounds a test head 14 and associated fixturing, and a control enclosure 16. The enclosure 12 is generally constructed of ⅜ inch thick transparent Lexan® panels generally forming an air-tight enclosure. Glue and screws may be used to join the panels at mutually engaging marginal edges and gaskets may be used as necessary to maintain the integrity of a controlled atmosphere within the enclosure 12. Strategically placed openings 18, 20 exist to flush smoke and other air-borne contaminants from the enclosure 12. The atmosphere within the enclosure 12 is controlled by purging the enclosure 12 with compressed air which is introduced into the enclosure 12 through a first opening 18 (FIG. 2) at the bottom of the enclosure 12 and outwardly forced through an opening 20 (FIG. 6) located in the top of the pump support column, and an adjustable position exhaust tube 52 (FIG. 2) which is positioned above and slightly behind the dielectric test sample. A fan 142 (FIG. 3) of sufficient air flow and pressure (e.g., Allied Electronics #599-0322)) is provided to maintain a constant air flow across the dielectric test sample at a linear velocity of 0.1 meter per second. Vinyl tubing is used to interconnect the fan 24 to the inlet of the enclosure 12. A vinyl tubing clamp 17 is used to fine tune the air flow velocity over the sample. A flow indicator 19 (e.g., Humonics Inc., model 570) having a display range of 0.5 to 700 mL per minute through a 9 mm capillary tube has been determined to provide the desired 0.1 meter per second linear flow velocity at a displayed volumetric flow rate of 94.3 mL.

Figure 2:
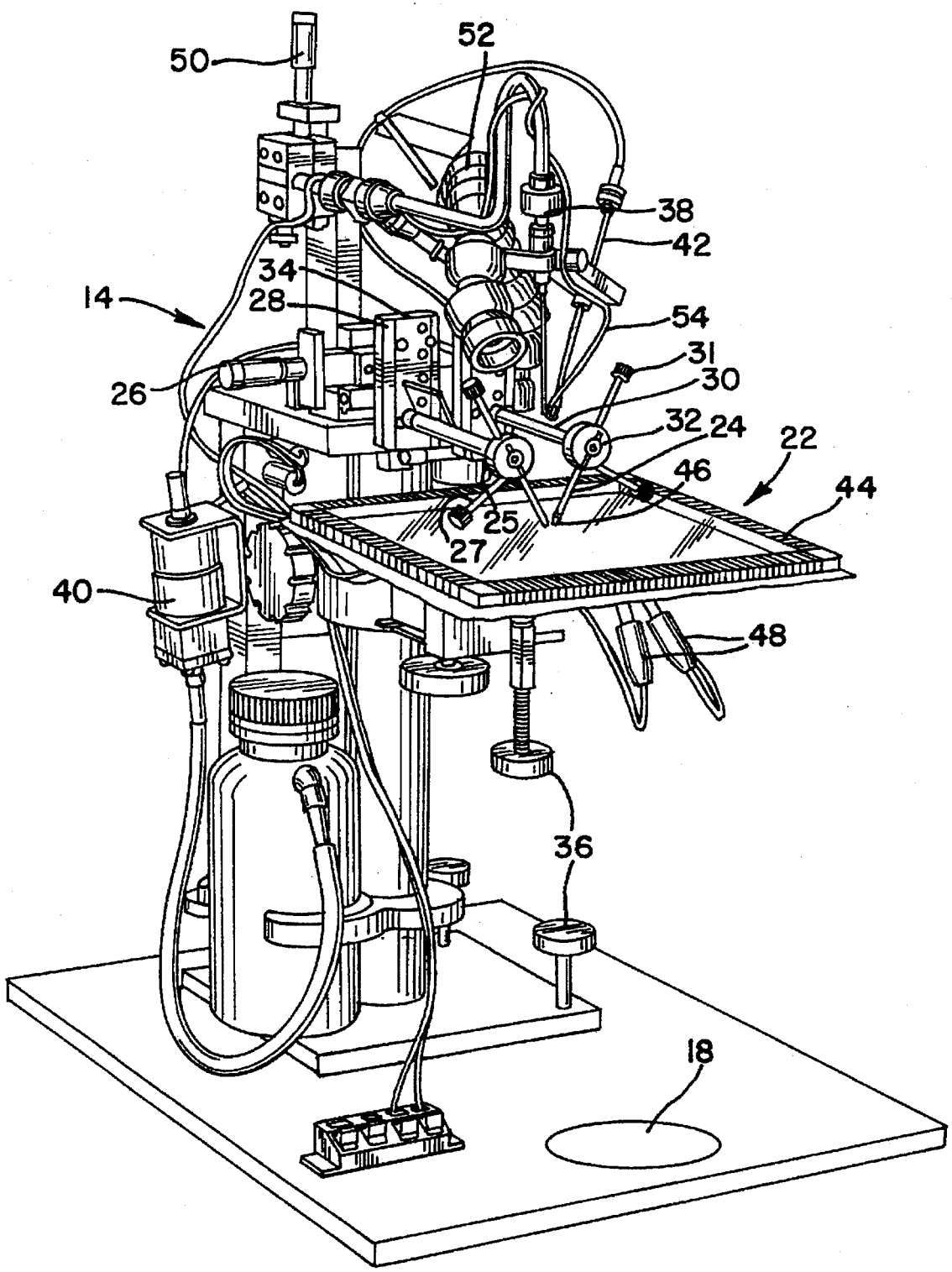
FIG. 2 is a perspective view of the test head of the test system of FIG. 1, but with portions of the transparent enclosure broken away for clarity.
Figure 3:
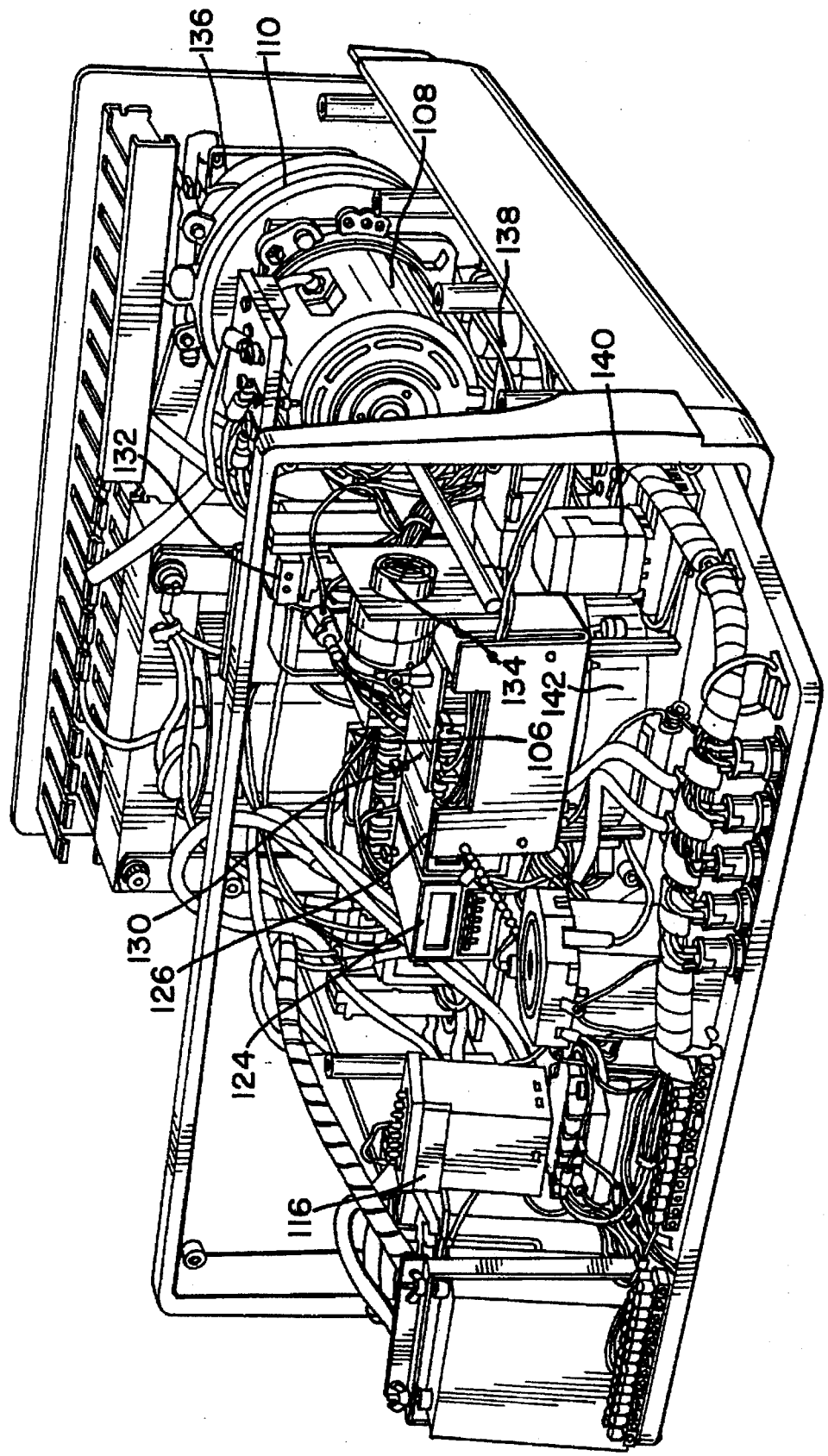
FIG. 3 is a rearward end perspective view of a partially disassembled control enclosure of the test system of FIG. 1.

The test head 14 (FIG. 1) includes a base 22 of a transparent material as shown in FIG. 2 (preferably glass) for support of the dielectric test sample during testing and for holding the test sample in contact with a pair of electrodes 24. Consistent with the CTI tests, the electrodes 24 are separated during testing by a specified horizontal distance and exert a specified force. The vertical positioning of electrodes 24 is controlled by linear bearings 28. The horizontal separation of the tips of the electrodes 24 is controlled by a micropositioner and slide assembly 26. While one electrode assembly (i.e., the electrode assembly on the right in FIG. 1) remains in a fixed horizontal position, the electrode assembly on the left may be precisely positioned by adjusting the micropositioner assembly 26. The micropositioner may be any appropriate positioning device (e.g., a micropositioner manufactured by Parker/Hannifin and sold by McMaster Carr of Chicago, Ill., under part number 5239A19). In the preferred embodiment, mutual separation of the electrodes may be precisely established by placing a calibration device such as a feeler gauge or calibration block between the electrodes and adjusting the micropositioner 26 to an appropriate position in close proximity to the calibration device.

The electrodes 24 are fabricated of 5 mm×2 mm rectangular platinum bars with a chisel point or rounded point with a specified radius, formed on the end of the bar along a long (5 mm) edge of the cross-section at a 30° angle to a longitudinal axis of the bar. The electrodes 24 are clamped within a slot within a circular hub 25 by an electrode clamping screw 27. The hub 25 is secured to a support arm 30 by a support arm clamping screw 31. The support arm clamping screw 31 allows for horizontal adjustment of electrode position in a direction parallel to the support arm 30 and for rotation of the electrodes 24 such that the chisel edges of opposing electrodes 24 are in parallel alignment. The electrode clamping screws 27 allows for axial adjustment of each electrode 24 such that the tip of each electrode extends a comparable distance from each hub 25.

Vertical positioning of the electrodes 24 is accomplished by a set of vertically oriented linear bearings 28 (e.g., Schneeberger model ND1-55.32 Micro Frictionless Tables) within which the electrode assemblies (i.e., electrodes 24 and supporting arms 30) are allowed to vertically float based upon the weight of each electrode assembly acting against the surface of the dielectric sample. In the preferred embodiment, the electrode assemblies are constructed to weigh 100 grams each and thereby, through the force of gravity, apply a force of 1N to the dielectric sample through each of the electrodes 24. As the electrodes become worn and resharpening becomes necessary, additional weight may be added to each electrode assembly by inserting small calibrated metal bars inside the hollow ends 32 of the support arms 30. Allowing the electrodes to float vertically improves the quality of the CTI test by providing a horizontally stable contact point even as the vertical contact point changes. Where the dielectric deflects upwards due to localized heating, the contact point and electrodes also float upwards in response while maintaining a constant contact pressure and distance. Where the dielectric softens or melts, the electrodes will begin to penetrate the dielectric under constant force and separation.

To isolate the electrodes 24 and support arms 30 and to allow a test voltage to be applied to the dielectric test sample through the electrodes 24, an electrical isolation block 34 (e.g., plexiglass) is interposed between the support arm 30 and linear bearing 28. Also, to further protect an operator against potential electrical shock during adjustment of the left electrode 24, the left electrode 24 is held at a ground potential while the right electrode 24 receives the full test voltage that may vary from 0 to 1000 volts. As further protection, door interlocks 126 are provided to disconnect power when the operator opens a door to adjust the electrode In accordance with the invention, the test head 14 and base 22 may be independently leveled. Leveling enhances the reliability of testing in the case of the dielectric test sample on the base 22 by assuring that the droplets of contaminant remain where deposited instead of draining towards the lowest point of the dielectric sample.

Leveling of the test head 14 also enhances reliability of testing, in a first instance, by insuring that the contaminant drip tube remains centered over the electrodes and, in a second instance, by effecting a reliable electrode contact force through proper vertical alignment of the linear bearings guiding the test electrodes 24. Adjustment leveling of the test head 14 and base 22 is accomplished by adjustment of respective leveling screws 36.

The drip tube 38 may be fabricated of a metal known to be resistant to contaminant induced corrosion (e.g., 304 stainless steel). The discharge end of the drip tube may be threaded to accept an appropriate droplet forming nozzle (e.g., a Fisher Scientific micro-valve part number 14-818-47B, Luer-Lock needle adapter supplied by Fisher Scientific under part number 14-818-48, and Luer-Lock needle from Fisher Scientific under part number SG-031576).

The height or distance of the nozzle of the drip tube 38 above a dielectric test sample supported on the base 22 is adjusted by a micropositioner 50. The micropositioner 50 may comprise any precision positioning device (e.g., a Parker/Hanifin micropositioner sold by McMaster Carr of Chicago, Ill. under part number 5239A19).

A sample pump 40 and droplet sensor 42 (FIG. 6) are used to control the rate under which droplets are deposited on the dielectric test sample. The pump 40 may comprise any variable volume (e.g., 0.01 to 0.04 ml per pulse) pumping device (e.g., Vicor Mfg. model number SV525A197-2 with 24–48 VDC coil) with provision to resist internal corrosion and contamination of the test liquid (e.g., all wetted parts are coated with VITON).

The droplet sensor 42 is used in conjunction with the pump 40 and a timer 124 (FIG. 4) to insure that a single droplet falls every 30 seconds. In the preferred embodiment, the timer 124 starts the pump which then runs until the droplet sensor 42 detects a droplet falling from the droplet nozzle at which time the pump is deactivated. The droplet sensor 42 may comprise a laser optical device operating in proximity to the droplet nozzle or a long range conventional optical device (e.g., an Omron model number E3C-J sensor).

The pump timer 124 (e.g., Omron model number H3CA-A24DC) is interconnected with a pump controller 126 (e.g., Omron model number H3CA-A24DC). Together, the pump timer 124 and controller 126 control the timing and volume of fluid contaminant delivered to the dielectric sample.

Also interconnected with the droplet sensor 42 is a droplet counter 122. The droplet counter 122 (e.g., Omron H7CN-XLNM 24 VDC with battery backup model number Y92S-20) counts the number of droplets delivered to the dielectric test sample during a test. A set-point (i.e., 50 drops) is entered into the droplet counter at a beginning of a test. At the end of the test (when the number of drops equals 50) the droplet counter 122 disables the controls of the test system 10 and provides an indication of "Test Complete" upon timeout of a 25 second shutdown delay timer 123. The results of the test, the CTI, is then read from the digital voltage display or a recorder as being the maximum continuous electrode voltage applied to the dielectric sample during the test.

Figure 4:
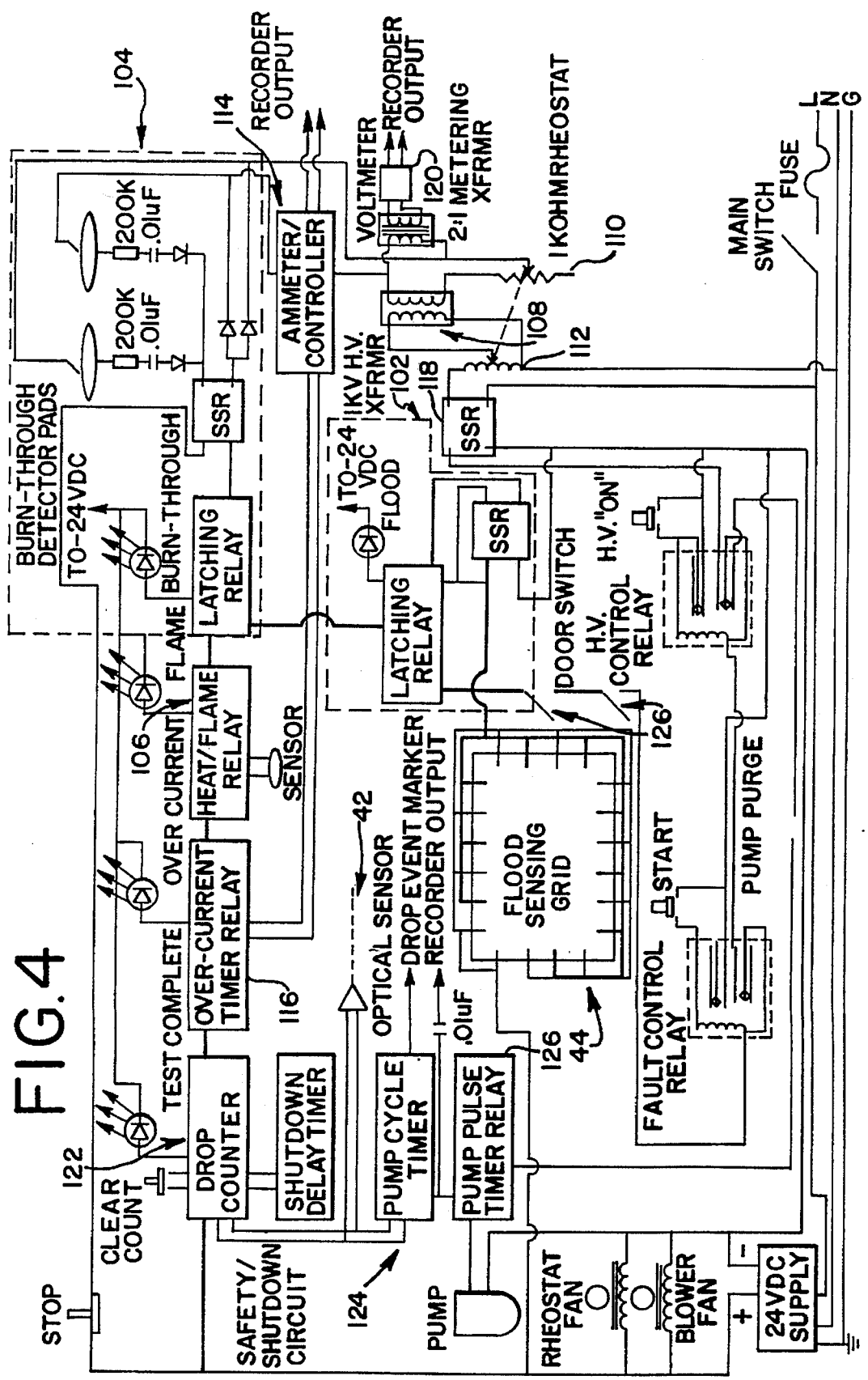
FIG. 4 is a schematic control circuit of the test system of FIG. 1.

In the event that too much moisture accumulates on the dielectric sample during a test resulting in overflow to the supporting base 22, a sensor 44 is provided to detect such flooding and take appropriate steps. The sensor 44 (Flood Sensing Grid) is shown in FIG. 4 as being a parallel series of strips (positive and negative sensor leads) interconnected either to a "+" connection of a 24 VDC Supply or to an input (solid state relay (SSR)) of a flooding shutdown circuit 102 activated when a droplet of water bridges a positive and negative lead. The flood control circuit upon activation is shown to interrupt control power to the test system 10.

Upon activation of the test system 10, the pump 40 is provided with a pump purge feature activated by a PUMP PURGE button. The PUMP PURGE button allows the pump 40 and associated piping to be purged of air and to be filled with a proper mixture of fluid and contaminant (e.g., $NH_4CL$).

Also provided on the base 22 is a set of burn-through contact pads 46. The contact pads 46 are flush with the surface of the base 22 and may be formed by drilling a pair of holes in the base 22 and filling such holes with solder. A pair of connector leads 48 are embedded in the solder to allow detection of the electrodes 24 burning through a dielectric test sample, thereby making contact with the contact pads 46. FIG. 4 illustrates in circuit format a burn-through control circuit 104 causing shut-down of the test system 10 upon the occurrence of burn-through by interruption of control power through a latching relay of the burn-through control circuit 104.

To further protect the test system 10, a J-type thermocouple 54 is provided directly above the electrodes 24 as a means of detecting ignition and the presence of flames. A temperature limit switch 106 (FIG. 4) (e.g., a Vulcan Electric Co. model number 891A16F) is used to deactivate the test system 10 when a detected temperature above the dielectric test sample exceeds safe threshold limits. The output contacts of the temperature limit switch 106 may also be used to activate a flame extinguisher.

Testing power for application to the dielectric test sample through electrodes 24 originates from a variable transformer 112 (e.g., Ohmite Mfg. Co. model number VT10), a step-up transformer 108 (e.g., Magnetic and Controls Inc. 1 kVA, (1000 volt at 1 ampere), 120 volts input), and rheostat 110 (e.g., Ohmite Mfg. Co. model number 1000 ohm, 300 W). The variable transformer 112 provides a voltage adjusting means through which a voltage applied to the dielectric may be controlled over a wide range. The step-up transformer 110 provides an 1:8 step-up in voltage necessary to cover the maximum voltage specified in Publication 112. The rheostat 110 functions to limit maximum current through the dielectric test sample to one ampere.

The rheostat 110 improves the quality of testing by reducing the magnitude of uncontrolled current and damage experienced during an arc. By ganging the rheostat 110 with the variable transformer 112, the magnitude of a limiting resistor (the rheostat 110) is automatically increased or decreased with an output voltage of the variable transformer 112.

Shown interconnected with an output of the step-up transformer 110 (FIG. 4) is an ammeter 114. The ammeter 114 may comprise a conventional current sensing device providing a true RMS reading (e.g., IMC Ottotek model number 708815) adapted to provide a recorder output signal upon sensing a preset current. The ammeter 114 is, in turn, connected to an over-current timer relay 116. The over-current timer relay 116, upon receiving an over-current signal from the ammeter 114, interrupts control power to the SSR 118, which in turn interrupts power to the variable transformer 112.

Connected across the output of the step-up transformer 108 and rheostat 110 is a 2:1 step-down transformer and voltmeter 120. The step-down transformer (e.g., Magnetics and Controls Inc., 1 kV input/500 V output) provides signal isolation between the main power supply 108, 110, 112 and the voltmeter 120 and also reduces the voltage applied to the voltmeter 120. The voltmeter 120 may comprise any digital voltmeter providing a true RMS voltage reading (e.g., IMC Ottotek model 208533010 with 3.5 digit display) providing a low-voltage recorder output.

Figure 5:
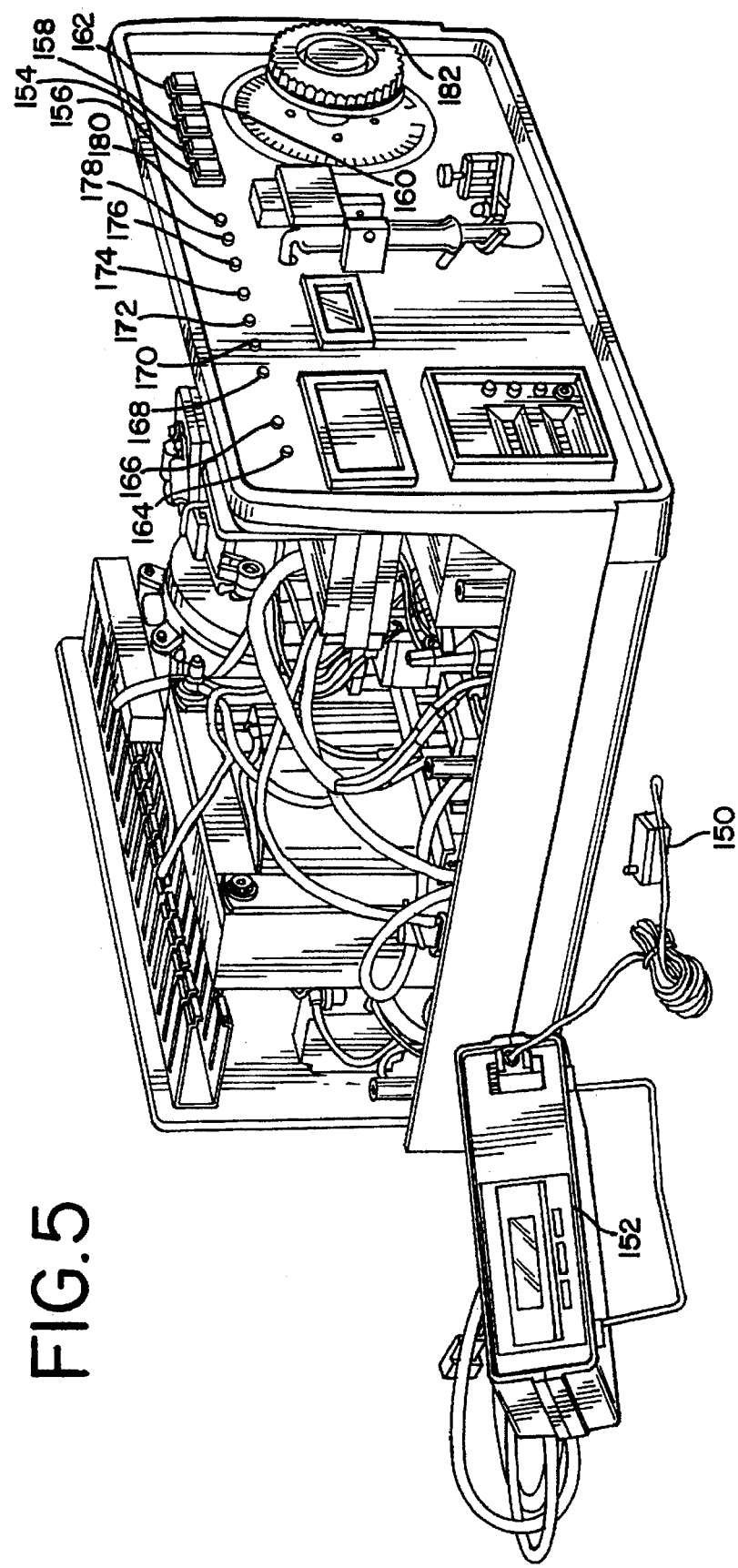
FIG. 5 is a perspective view of the partially disassembled control enclosure of the test system of FIG. 1 but taken from its forward end.

In the operation of the test system 10, an operator (not shown) begins by placing a load calibrating device on the base 22 beneath the lower tips of the inclined electrodes. The operator then positions the tips of the electrodes onto the calibrating device, measures and, if necessary, calibrates the vertical force exerted by the electrodes 24 on the test sample. The operator measures the vertical force through use of the load cell 150 (e.g., Transducer Techniques model number GS-150 with a model number ALS04 load button) and load indicator 152 (e.g., Transducer Techniques model number DPM-2) as illustrated in FIG. 5. The load cell is placed under each of the electrodes 24 and the downward force supplied by each of the electrodes 24 noted. If the load varies outside of the limits specified in the applied standard, then calibrating weights may be either added or removed from the support arms 30 of the electrodes 24.

Next, the operator purges the pump 40 and droplet nozzle 38 by activating a purge button 154. Fluid contaminant discharged from the droplet nozzle 38 during purging may be caught in a cup or other receptacle during purging.

Following purging the operator calibrates the electrode spacing using the procedures described above. Following calibration of the electrode spacing the operator may raise the electrodes 24 and place a dielectric test sample under the electrodes 24. After installing the test sample the operator would close the enclosure 12 and press the "Test Start" button 158 and the "Drop Count Clear" button 156. The operator may also verify that the "Power" 164 indicator light is illuminated and that the other indicator lights "Test Complete" 168, "Sample Burn Through" 170, "Drop Detected" 172, "Pump Cycle" 166 "Overcurrent" 174, "Flood" 176, "Door Open" 178, and "Flame" 180 were off.

The operator then sets an initial test voltage by adjusting the control knob 182 which is ganged with the rheostat 110 and variable transformer 112. The operator may then press the "High Voltage On" button. The operator may again visually scan the indicator lights for indication of normal operating conditions.

After 30 seconds the pump cycle timer 124 would time out and activate the pump 40. After a suitable interval a droplet would form on the end of the droplet nozzle 38 and fall toward the test sample. The droplet detector 42 would detect the fall of the droplet and reset the pump timer 124. The droplet detector would also increment the drop counter 122.

As each droplet falls between the electrodes 24, current will being to flow through the accumulated moisture driving off some of the moisture as steam. Alternatively, as more drops fall, arcing may occur across the dielectric between the electrodes 24. If any incidence of current flow exceeds 0.5 ampere for two seconds, the test will be automatically be interrupted via the ammeter 114 and over-current timer relay 116 and an indicator light 174 will be illuminated.

If the test is terminated by overcurrent, the operator will move the electrodes 24 to a new location on the dielectric test sample and begin a new test at a lower voltage. If the test were terminated for sample burn-through or flame the operator would also move the electrodes to a new location and begin a new test.

If, on the other hand, the droplet counter 122 has a drop total in excess of 50 drops, then the operator reads the voltage recorder for a CTI rating for that test. Initially the test voltage begins at 600 V and is reduced for each new test until 50 drops of the contaminant can be applied before failure.

As demonstrated above, the test system 10 provides a means for testing a dielectric sample for susceptibility to surface failure by tracking that is not taught by the prior art. The apparatus for purging the test chamber eliminates the problems of smoke or other air-borne materials contaminating the droplet nozzle. The use of floating supports for the electrodes 24 allows the electrodes to maintain contact with the dielectric material even under conditions of severe burning. The use of a rheostat ganged with a variable transformer reduces damage to dielectric and electrodes during arcs occurring at relatively high voltages while still allowing for higher relative currents at lower voltages. The flood sensing grid provides a means of terminating testing where problems unrelated to arcing may ultimately invalidate the results of a test anyway.

While a preferred embodiment of an apparatus or test system for testing a dielectric sample for susceptibility to surface failure by tracking, and its manner of operation, has been illustrated and described, it should be understood that variations and modifications of the invention in its various aspects will be apparent to those skilled in the art, and that the invention is not limited by the specific embodiments described. It is therefore contemplated to cover by the present invention any modifications, variations, or equivalents that fall within the true spirit and scope of the basic underlying principles disclosed and claimed herein.

What is claimed is:

1. Apparatus for testing a dielectric sample for susceptibility to surface electrical failure due to tracking, such apparatus comprising: an enclosure adapted to be continuously purged of air-borne contaminants; a base disposed within the enclosure for supporting a dielectric sample; a pair of mutually separated electrodes operably interconnected with a variable voltage power supply and engaging the dielectric sample on a first side; a source of water and water borne contaminants adapted to intermittently discharge the water and water-borne contaminants onto the dielectric sample between the electrodes.

2. The apparatus as in claim 1 wherein the water borne contaminant comprises $NH_4CL$.

3. The apparatus as in claim 1 further comprising a voltmeter for measuring a maximum true RMS voltage across the electrodes when a current through the electrodes substantially equals no more than one-half ampere for two seconds.

4. The apparatus as in claim 3 wherein the maximum voltage further comprises a comparative tracking index or CTI.

5. The apparatus as in claim 1 further comprising a true RMS ammeter for measuring a current of the variable voltage power supply passing through the electrodes.

6. The apparatus as in claim 1 wherein the purging of the enclosure occurs at a linear rate of substantially one tenth meter per second.

7. The apparatus as in claim 1 wherein the pair of electrodes further comprises a pair of vertically floating support brackets.

8. The apparatus as in claim 1 wherein the source of water and water borne contaminants intermittently discharging the water and water-borne contaminants further comprise a pump.

9. The apparatus as in claim 8 wherein the source of water and water borne contaminants intermittently discharging the water and water-borne contaminants further comprise a timer operably interconnected to activate the pump after a fixed time interval.

10. The apparatus as in claim 8 wherein the source of water and water borne contaminants intermittently discharging the water and water-borne contaminants further comprise a drop sensor operably interconnected with the timer to reset the timer after each activation of the drop sensor.

11. The apparatus as in claim 1 further comprising a flame sensor for deactivating the power supply upon ignition of the dielectric test sample.

12. Apparatus for testing a dielectric sample for susceptibility to surface electrical failure due to tracking, such apparatus comprising: a base for supporting the dielectric sample; a pair of mutually separated electrodes restrained by a pair of vertically floating mounting brackets, operably interconnected with a variable voltage power supply and engaging the dielectric sample on a first side; a source of an electrolyte adapted to intermittently discharge the electrolyte onto the dielectric sample between the electrodes.

13. The apparatus as in claim 12 wherein the electrolyte further comprises $NH_4Cl$ or a similar conducting contaminant solution.

14. The apparatus as in claim 12 further comprising a voltmeter for measuring a maximum true RMS voltage across the electrodes when a current through the electrodes substantially equals no more than one-half ampere for two seconds.

15. The apparatus as in claim 14 wherein the maximum voltage further comprises a comparative tracking index or CTI.

16. The apparatus as in claim 12 further comprising a true RMS ammeter for measuring a current of the variable voltage power supply passing through the electrodes.

17. The apparatus as in claim 12 wherein the source of the electrolyte intermittently discharging the electrolyte further comprise a pump which precisely controls electrolyte drop volume.

18. The apparatus as in claim 17 wherein the source of electrolyte intermittently discharging the electrolyte further comprise a timer operably interconnected to activate the pump after a fixed time interval.

19. The apparatus as in claim 18 wherein the source of electrolyte intermittently discharging the electrolyte further comprise a drop sensor operably interconnected with the timer to reset the timer after each activation of the drop sensor.

20. The apparatus as in claim 12 further comprising a flame sensor for deactivating the power supply upon ignition of the dielectric sample.

21. A method for testing a dielectric sample for susceptibility to surface electrical failure due to tracking within an enclosure adapted to be continuously purged of air-borne contaminants and eliminating external drafts having a base disposed within the enclosure for supporting the dielectric sample; a pair of vertically floating mutually separated electrodes operably interconnected with a variable voltage power supply and engaging the dielectric sample on a first side; and a source of electrolyte adapted to intermittently discharge the electrolyte onto the dielectric sample between the electrodes, comprising the steps of: purging the enclosure of air-borne contaminants eliminating external drafts; engaging the dielectric sample with the pair of electrodes; applying a voltage across the pair of electrodes; intermittently depositing the electrolyte onto the sample between the electrodes; measuring a true RMS voltage across the electrodes and true RMS current which flows through the electrodes for at least two seconds.

22. The method as in claim 21 further comprising the step of disposing the dielectric test sample on the base.

23. The method as in claim 21 further comprising the step of counting the intermittent discharges of electrolyte.

24. The method as in claim 23 further comprising the step of activating a test complete light when the count exceeds a threshold before the current of no more than one-half ampere flows through the electrodes for at least two seconds.

25. The apparatus as in claim 1 wherein the source of water and water-borne contaminants further comprises a droplet forming nozzle.

26. The apparatus as in claim 1 wherein the base disposed within the enclosure further comprises glass.

* * * * *

UNITED STATES PATENT AND TRADEMARK OFFICE
CERTIFICATE OF CORRECTION

PATENT NO. : 5,638,003
DATED : Jun. 10, 1997
INVENTOR(S) : Hall

It is certified that error appears in the above-indentified patent and that said Letters Patent is hereby corrected as shown below:

```
Col. 2, line 21, change "Publications" to --publications--.
Col. 2, line 26, delete "³".
Col. 2, line 59, change "objective" to --object--.
Col. 2, line 64, change "objective" to --object--.
Col. 3, line 1, change "objective" to --object--.
Col. 3, line 5, change "objectives" to --objects--.
Col. 3, line 10, change "are" to --is--.
Col. 3, line 12, change "engage" to --engages--.
Col. 3, line 13, change "water borne" to --water-borne--.
Col. 3, line 34, change "are" to --is--.
Col. 3, line 34, change "trigger" to --triggers--.
Col. 3, line 35, after "burn-through" insert --,--.
Col. 3, line 37, change "additions" to --addition--.
Col. 3, line 39, after "maintain" insert --a--.
Col. 3, line 43, change "electrodes" to --electrodes'--.
Col. 4, line 4, delete "and"
Col. 4, line 7, change "." to --; and--.
Col. 4, line 17, change "112," to --112--.
Col. 4, line 38, delete the second ")".
Col. 4, line 47, after "94.3 mL" insert --per minute--.
Col. 5, line 16, change "allows" to --allow--.
Col. 5, line 53, after "electrode" insert --24.--
Col. 5, line 61, change "insuring" to --ensuring--.
Col. 6, line 24, change "insure" to --ensure--.
Col. 6, line 47, change "results" to --result--.
Col. 7, line 26, after "ampere" delete the ")".
Col. 8, line 28, change "were" to --are--.
Col. 8, line 44, change "being" to --begin--.
```

UNITED STATES PATENT AND TRADEMARK OFFICE
CERTIFICATE OF CORRECTION

PATENT NO. : 5,638,003
DATED : Jun. 10, 1997
INVENTOR(S) : Hall

It is certified that error appears in the above-indentified patent and that said Letters Patent is hereby corrected as shown below:

```
Col. 8, line 44, after "moisture" insert --,--.
Col. 8, line 48, delete the first occurrence of "be".

Col. 9,  line 28, after "side;" insert --and--.
Col. 9,  line 52, change "comprise" to --comprises--.
Col. 9,  line 55, change "water borne" to --water-borne--.
Col. 9,  line 56, change "comprise" to --comprises--.
Col. 9,  line 62, change "comprise" to --comprises--.
Col. 10, line 5,  after "side;" insert --and--.
Col. 10, line 23, change "comprise" to --comprises--.
Col. 10, line 27, change "comprise" to --comprises--.
Col. 10, line 31, change "comprise" to --comprises--.
Col. 10, line 51, after "electrodes;" insert --and--.
```

Signed and Sealed this

Fourth Day of November, 1997

Attest:

BRUCE LEHMAN

Attesting Officer

Commissioner of Patents and Trademarks